United States Patent
Geissler et al.

(10) Patent No.: US 6,911,789 B2
(45) Date of Patent: Jun. 28, 2005

(54) POWER SUPPLY FOR A HOT-FILAMENT CATHODE

(75) Inventors: Steven J. Geissler, Ft. Collins, CO (US); James R. Kahn, Ft. Collins, CO (US); Harold R. Kaufman, Laporte, CO (US); Denis M. Shaw, Ft. Collins, CO (US)

(73) Assignees: Kaufman & Robinson, Inc., Ft. Collins, CO (US); Advanced Energy Industries, Inc., Ft. Collins, CO (US)

( * ) Notice: Subject to any disclaimer, the term of this patent is extended or adjusted under 35 U.S.C. 154(b) by 62 days.

(21) Appl. No.: 10/379,057

(22) Filed: Mar. 4, 2003

(65) Prior Publication Data

US 2004/0183470 A1 Sep. 23, 2004

(51) Int. Cl.[7] .................. H05B 37/02; H02M 7/5387
(52) U.S. Cl. .................................. 315/291; 363/132
(58) Field of Search ......................... 315/291, 293, 315/313, 320, 366, 105, 106, 107; 363/132, 16, 95, 131, 2, 58, 98; H05B 37/02; H02M 7/5387

(56) References Cited

U.S. PATENT DOCUMENTS

| | | | |
|---|---|---|---|
| 4,651,058 A | | 3/1987 | Hamada et al. ............... 315/98 |
| 4,816,724 A | | 3/1989 | Hamada et al. ............. 315/366 |
| 4,912,375 A | * | 3/1990 | Deglon et al. .............. 315/306 |
| 5,187,413 A | * | 2/1993 | Araki et al. ................ 315/291 |
| 5,541,827 A | * | 7/1996 | Allfather ..................... 363/17 |
| 5,565,743 A | * | 10/1996 | Yamashita et al. .......... 315/310 |
| 5,991,169 A | * | 11/1999 | Kooken ....................... 363/17 |
| 6,304,475 B1 | * | 10/2001 | Iwata et al. ................ 363/132 |

OTHER PUBLICATIONS

Olson, Ion Milling Induced ESD Damage During MR Head Fabrication, EOS/ESD Symposium 98–332 (1998).
Kaufman et al.,Ion SOurce Design for Industrial Applications, AIAA Journal, vol. 20, No. 6, p. 745 (1982)—p. 760.
Zhurin et al., Physics of closed drift thrusters, Plasma Sources Sci. Technol. 8, p. R1–R20 (1999).
Spangenberg, Vacuum Tubes, Chapter 4–Electronic Emission, p. 23–57 (1948).
Kaufman et al., Characteristics, Capabilities, and Applications of Broad–Beam Sources, 1987.

* cited by examiner

*Primary Examiner*—Trinh Vo Dinh
(74) *Attorney, Agent, or Firm*—Dean P. Edmundson

(57) ABSTRACT

In accordance with one embodiment of the present invention, there is provided a switch-mode power supply to generate the heating current for a hot-filament electron-emitting cathode. The power supply directly couples, without an output transformer, the output from a full-bridge converter that operates at an output frequency in the range from ten Hz to ten kHz. A connection to a reference potential that minimizes the potential fluctuation of the cathode is provided by one of the direct-current inputs to the converter.

10 Claims, 6 Drawing Sheets

POWER SUPPLY FOR A HOT-FILAMENT CATHODE

FIELD OF INVENTION

This invention relates generally to ion and plasma sources, and more particularly it pertains to the power supplies that generate heating currents for the electron-emitting, hot-filament cathodes incorporated in such sources.

BACKGROUND ART

Applications for industrial ion and plasma sources include etching, deposition and property modification, as described by Kaufman, et al., in the brochure entitled *Characteristics, Capabilities, and Applications of Broad-Beam Sources*, Commonwealth Scientific Corporation, Alexandria, Va. (1987).

Both gridded and gridless ion sources are used in these industrial applications. Gridded ion sources are described in an article by Kaufman, et al., in the AIAA Journal, Vol. 20 (1982), beginning on page 745. The end-Hall ion source is one type of gridless ion source and is described in U.S. Pat. No. 4,862,032—Kaufman, et al., while the closed-drift ion source is another type of gridless ion source and is described by Zhurin, et al., in an article in *Plasma Sources Science & Technology*, Vol. 8, beginning on page R1. These publications are incorporated herein by reference.

Both gridded and gridless ion sources incorporate electron-emitting hot-filament cathodes. These cathodes function as cathode-neutralizers in gridless ion sources and as both discharge-chamber cathodes and neutralizers in gridded ion sources. Power supplies provide heating currents for these cathodes, where the heating current increases the cathode temperature sufficiently for the thermionic emission of electrons. Some of the materials, operating conditions, common problems, and lifetime limitations of hot-filament cathodes are described by Kaufman, et al., in Chapter 3 of the book, *Operation of Broad-Beam Sources*, Commonwealth Scientific Corporation, Alexandria, Va. (1984).

The design techniques for these power supplies employ a conversion frequency to convert from line voltage and current to output voltage and current. This conversion frequency is either 50–60 Hz or a considerably higher frequency, typically ≧25 Khz. The 50–60 Hz techniques are called "linear/line-frequency-phase-control" (or "linear/LFPC") herein. The techniques in which a conversion frequency independent of line frequency is generated and digital on-off states are used for the power switching devices are called "switch-mode." Examples of switch-mode techniques are given by Pressman in the book, *Switching Power Supply Design*, McGraw-Hill, Inc., New York (1991).

Power supplies based on linear/LFPC have been readily available for many years, but are large and heavy, due mostly to the large, heavy 50–60 Hz transformers that are incorporated. Power supplies based on switch-mode techniques have been readily available for the last two decades and are characterized by smaller sizes and lighter weights, due to the much smaller and lighter transformers that can be used at the higher frequencies.

The heating current generated by the power supplies is of two types: direct current (dc) and alternating current (ac) Either linear/LFPC or switch-mode power supplies can be used to generate a dc heating current for a hot-filament cathode. With either type of power supply, however, the cathode lifetime is substantially reduced due to the dc nature of the current.

Either linear/LFPC or switch-mode power supplies can also be used to generate an ac heating current. In either case the power output from a well-designed supply is from an output transformer operating at the conversion frequency that is used, i.e., either 50–60 Hz or ≧25 Khz. While the use of a 50–60 Hz output frequency presents no problems, the reactive impedances in the transmission line between the power supply and the cathode are significant at the ≧25 Khz frequency. These reactive impedances cause impedance matching problems.

The use of an output transformer permits the connection to a reference potential to be made through a center tap in the transformer secondary to minimize plasma disturbances and increase filament lifetime. In the discharge chamber of a gridded ion source, the reference potential is the negative terminal of the discharge supply. In the neutralizer of a gridded ion source or the cathode-neutralizer of a gridless ion source, the reference potential is usually ground. If a discharge is used to generate a plasma that fills a vacuum chamber, the reference potential would usually be the potential of the vacuum chamber.

In summary, linear/LFPC power supplies that generate 50–60 Hz heating currents are widely used, but are large and heavy due to the transformers used in them. Switch-mode power supplies that generate ac heating currents at a ≧25 Khz conversion frequency are much smaller and lighter, but are limited by impedance and impedance-matching effects of the transmission line between the power supply and the hot-filament cathode.

SUMMARY OF INVENTION

In light of the foregoing, it is an object of the present invention to provide a power supply for a hot-filament, electron-emitting cathode that is small and light, but does not have significant transmission-line impedance problems.

Another object of the present invention is to use switch-mode techniques to generate a heating current for such a cathode without the reduced lifetime of using direct current.

Yet another object of the present invention is to use switch-mode techniques to generate an ac heating current for such a cathode at an output frequency independent of the conversion frequency.

Still another object of the present invention is to provide a switch-mode power supply for such a cathode that can generate a heating current at an output frequency high enough so that the period for a cycle is short compared to the thermal time constant of the hot-filament cathode.

A further object of the present invention is to provide a switch-mode power supply for such a cathode that can generate a heating current at an output frequency low enough so that the transmission-line impedance matching problems are substantially reduced.

A yet further object of the invention is to use switch-mode techniques to generate a heating current for such a cathode without using an output transformer.

A still further object of the invention is to provide a power supply for such a cathode that is simple, economical, and reliable.

In accordance with one embodiment of the present invention, there is provided a switch-mode power supply to generate the heating current for a hot-filament electron-emitting cathode. The power supply directly couples, without an output transformer, the output from a full-bridge converter that operates at an output frequency in the range from ten Hz to ten Khz. A connection to a reference potential that minimizes the potential fluctuation of the cathode is provided by one of the direct-current inputs to the converter.

DESCRIPTION OF FIGURES

Features of the present invention which are believed to be patentable are set forth with particularity in the appended claims. The organization and manner of operation of the invention, together with further objectives and advantages thereof, may be understood by reference to the following descriptions of specific embodiments thereof taken in connection with the accompanying drawings, in the several figures of which like reference numerals identify like elements and in which:

DESCRIPTION OF PRIOR ART

Figure 1:
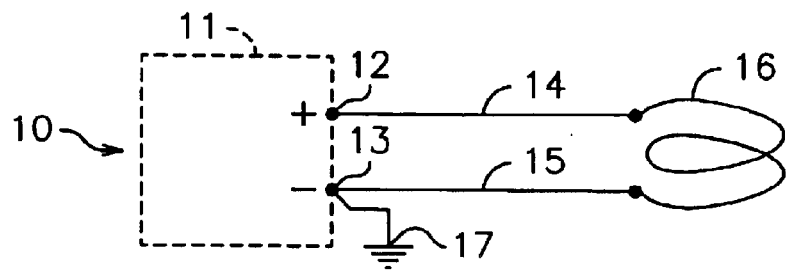
FIG. 1 is a simplified electrical circuit diagram of a hot-filament, electron-emitting cathode together with a prior-art direct-current power supply to generate the heating current for the cathode.

Referring to FIG. 1, there is shown prior-art power supply 10 within enclosure 11 for generating a direct (dc) heating current to positive terminal 12 and negative terminal 13. As is well known to those skilled in the art, power supply 10 can use either linear/LFPC (50–60 Hz) or switch-mode (approximately ≧25 Khz) techniques. Rack-mount power supplies using both techniques are manufactured by Lambda EMI, Neptune, N.J. Their TCR Series use linear/LFPC techniques, while their EMS Series uses switch-mode techniques. Comparing similar power ratings in the 1–2 Kw range, the switch-mode power supplies are about half the height of the linear/LFPC supplies and weigh about one-third as much. The switch-mode power supplies thus have substantial size and weight advantages over the linear/LFPC designs.

Terminals 12 and 13 of power supply 10 are connected to transmission-line conductors 14 and 15, which in turn are connected to electron-emitting hot-filament cathode 16. Terminal 13 is also connected to a reference potential, in this case ground 17. Inasmuch as the circuit is a dc one, the resistances of transmission-line conductors 14 and 15 are the important transmission-line parameters. For efficient operation, these resistances should be small compared to the operating resistance of cathode 16. In plasma and ion-beam apparatus, the ground is usually the potential of the surrounding vacuum chamber which in turn is usually, but not always, at earth ground. The connection of the reference potential could have been made to terminal 12 instead. Also, as described in the Background Art section, the reference potential could also be the negative terminal of a discharge supply.

Figure 1A:
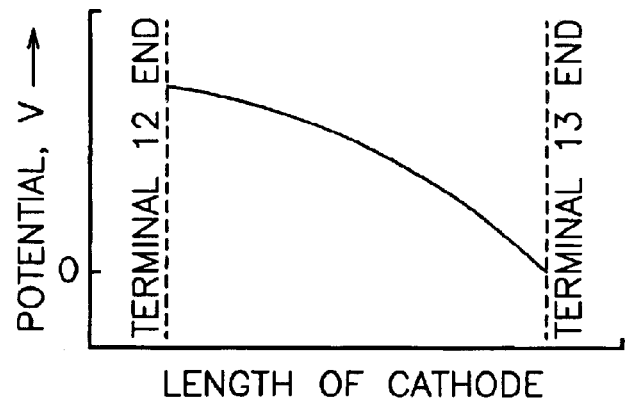
FIG. 1a shows the potential distribution along the hot-filament cathode of FIG. 1.

Referring to FIG. 1a, there is shown the potential distribution along hot-filament cathode 16 of FIG. 1, where the potential distribution results from the electrical resistance of the cathode and the distribution of heating current therein. As would be expected, the cathode is at a more positive potential at the end closest to positive terminal 12. With ground defined as zero potential, the cathode end closest to terminal 13 is approximately zero potential. Hot-filament cathodes are almost always fabricated from a refractory-metal wire (typically tantalum or tungsten) with a uniform circular cross section. To do otherwise would be both inconvenient and expensive. With a uniform cross section, one might expect the potential to be distributed uniformly along the cathode. The potential distribution shown in FIG. 1a is not uniform over the length of the cathode, but drops more rapidly near the end closest to negative terminal 13. To explain this non-uniform distribution, it is helpful to consider the currents to and from cathode 16.

Figure 1B:
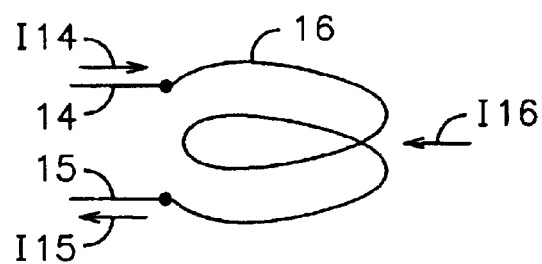
FIG. 1b is a simplified electrical circuit diagram of the hot-filament cathode of FIG. 1 together with its connecting transmission-line conductors, showing conventional currents and their directions.

Referring to FIG. 1b, there is shown hot-filament cathode 16 of FIG. 1 and portions of connecting conductors 14 and 15, together with the directions of conventional currents to this cathode. Current I14 is the current to cathode 16 in transmission-line conductor 14 and current I15 is the current from that cathode in transmission-line conductor 15. Note that the conventional current representation results in the electron emission from cathode 16 becoming conventional current I16 to that cathode. From conservation of current to the cathode, $$I14 - I15 + I16 = 0. \quad (1)$$

Because I14, I15, and I16 are all positive quantities with directions as defined in FIG. 1b and used in Equation (1), $$I15 > I14. \quad (2)$$

To give a specific example of this imbalance, the EH1000, a commercial end-Hall ion source manufactured and sold by Kaufman & Robinson, Inc., has a tungsten cathode-neutralizer that is 0.51 mm in diameter with an overall length of about 15 cm. The heating current, approximately an average of I14 and I15, is in the range of 12–20 A, being near the high value during startup and near the low value at end of life. A typical electron emission, I16, is 5 A. The emission is thus 25–40 percent of the mean heating current. For a dc heating current, this means that the end of hot-filament cathode 16 shown in FIG. 1 that is closest to terminal 13 becomes much hotter than the other, with most of the emission as well as most of the sublimation and chemically assisted erosion occurring nearer that end.

The degree to which the concentration of emission takes place may not be readily apparent to one unskilled in the art. The emission equation includes an exponential term, which Spangenberg in Chapter 4 of the book, *Vacuum Tubes,* McGraw-Hill Book Company, New York (1948), says "causes the emission-temperature function to be one of the most rapidly varying functions found in nature." From FIG. 4.10 in the aforementioned chapter, it is shown that a drop of 25 percent in heating current for a given diameter of tungsten wire results in a more than 95 percent drop in emission. From a theoretical viewpoint, it should be clear that an emission current which is 25–40 percent of the mean dc heating current will have a major effect on cathode operation. Experimentally, the cathode lifetime with a dc heating current is about half that with a balanced or symmetrical ac heating current, which will be described in connection with the circuit of FIG. 2.

One obvious solution to the current imbalance of relation (2) is to use much larger heating currents, so that the emission is a smaller fraction of the heating current. The transmission-line conductors are comprised of the cable between the power supply 10, the electrical feedthroughs in the vacuum-chamber wall, and the cables inside the vacuum chamber. The typical cable length from a cathode power supply 10 to a vacuum chamber is 6 meters, while the typical cable length internal to the vacuum system is 40 cm. Increasing the current capacity of these cables results in a variety of weight, safety, power, ease of handling, and hardware problems. In addition, high-current electrical feedthroughs are expensive and take up more space than feedthroughs designed for lower currents. Increasing the heating current is thus neither inexpensive or convenient.

Note that the current imbalance in the circuit shown in FIG. 1 does not depend on the reference potential connection to terminal 13. The potential of the cathode would extend below zero if the reference potential were connected to terminal 12, instead of terminal 13, but the same current imbalance and cathode lifetime limitation would exist.

Another solution, perhaps less obvious, is to alternate the emission and current functions, so that the two functions do not occur at the same time, in the manner used for the electron sources incorporated in flat displays (see U.S. Pat. No. 4,651,058—Hamada, et al., or U.S. Pat. No. 4,816,724—Hamada, et al.). Depending on the exact implementation, such an approach could greatly reduce or eliminate the potential variation along the hot-filament cathode during emission, hence reduce or eliminate the nonuniform erosion of the cathode. For heating currents of the order of 20 A and heating powers of several hundred watts, however, such a power-supply apparatus would be neither simple nor economical.

Figure 2:
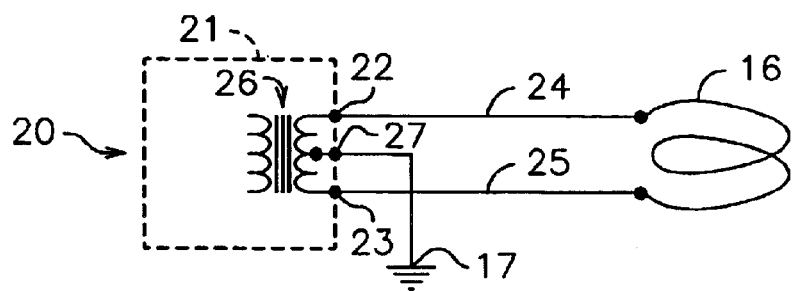
FIG. 2 is a simplified electrical circuit diagram of a hot-filament, electron-emitting cathode together with a prior-art alternating-current power supply to generate the heating current for the cathode.

Referring to FIG. 2, there is shown prior-art alternating-current (ac) power supply 20 within enclosure 21 for generating an alternating heating current to output terminals 22 and 23. Terminals 22 and 23 of power supply 20 are connected to transmission-line conductors 24 and 25, which in turn are connected to electron-emitting hot-filament cathode 16. Within power supply 20 there is output transformer 26, the secondary of which is connected to output terminals 22 and 23. The center tap of the secondary is connected to output terminal 27 which, in turn, is connected to a reference potential, in this case ground 17. As discussed in connection with FIG. 1, other reference potentials could have been used. Inasmuch as the circuit in FIG. 2 is an ac one, both the resistances and reactive impedances of transmission-line conductors 24 and 25 can be important. In general, the most serious transmission-line design and operating problems result from the reactive impedances at the higher ac frequencies, approximately $\geq 25$ Khz.

Figure 2A:
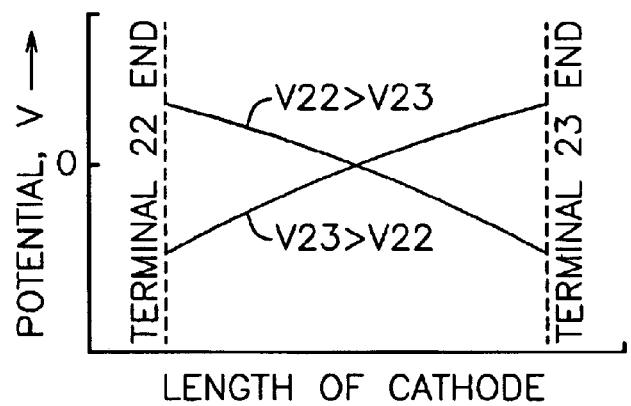
FIG. 2a shows the potential distributions along the hot-filament cathode of FIG. 2.

Referring to FIG. 2a, there are shown the potential distributions along hot-filament cathode 16 of FIG. 2, where the potential distributions result from the electrical resistance of the cathode and the distribution of heating currents therein. Because an ac heating current is used for the cathode, two curves are shown for the peak heating currents in the two directions. One is for the case where the cathode potential nearest terminal 22, V22, is greater than the cathode potential nearest terminal 23, V23 (V22>V23), while the other is for the case where the cathode potential nearest terminal 23 is greater than the cathode potential nearest terminal 22 (V23>V22). With the curves drawn for the maximum currents in the two directions, the potential distributions represent the potential extrema. If the waveform is other than a square wave, there are potential distributions intermediate of the two extrema.

Figure 2B:
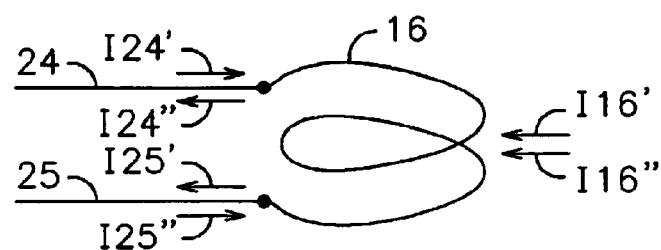
FIG. 2b is a simplified electrical circuit diagram of the hot-filament cathode of FIG. 2 together with its connecting transmission-line conductors, showing conventional currents and their-directions.

Referring to FIG. 2b, hot-filament cathode 16 of FIG. 2 is shown there together with conventional ac currents to this cathode and their directions. These currents are defined in a manner similar to those in FIG. 1b, except that primed quantities denote currents for the case where terminal 22 is positive relative to terminal 23 (V22>V23), and double-primed quantities denote currents for the case where terminal 23 is positive relative to terminal 22 (V23>V22). For the primed case, the current balance from conservation of current is similar to the dc case and $$I24'-I25'+I16'=0, \quad (3)$$

$$I25'>I24'. \quad (4)$$

For the double primed case, the currents are such that $$I25''-I24''+I16''=0, \quad (5)$$

$$I24''>I25''. \quad (6)$$

The two curves shown in FIG. 2a were drawn with the assumption that the potential waveform from power supply 20 is symmetrical for the two half-cycles of heating current. That is, except for sign, the shape and amplitude of the waveform is the same. Although nonsymmetrical waveforms have been used in ac power supplies, symmetrical ones are more common. With this assumption and the center tap of transformer 26 connected to terminal 27, which in turn is connected to the reference potential, the potential distributions along cathode 16 are also symmetrical for the two half-cycles of the heating current. The only potential fluctuations are the ends of cathode 16 oscillating about a constant mean value of zero.

For the symmetrical potential distributions in the primed and double primed cases in FIG. 2a, the heating of the cathode is also symmetrical and it follows that $$I16'=I16''. \quad (7)$$

$$I25'-I24'=I24''-I25''. \quad (8)$$

The balanced or symmetrical current distributions of Equations (7) and (8) constitute the preferred prior-art approach for heating hot-filament cathodes, and offers a substantial cathode-lifetime advantage over the dc distribution of Equations (1) and (2).

While the above description of currents and cathode heating assumes complete symmetry, it should be apparent that moderate departures from symmetry will result in moderate lifetime penalties. Departures from symmetrical heating of 10, 20, or even 30 percent would still permit most of the increased-lifetime benefits of using an ac heating current. Such departures could, for example, result from the non-symmetrical firing of poorly matched silicon controlled rectifiers.

It should be pointed out that, for any of the ac frequencies mentioned (50–60 Hz to over 25 Khz), the thermal time-constant of a typical hot-filament cathode is much greater than the period of the ac current. The temperature of the hot-filament cathode is therefore a function of the time-averaged heating, not the instantaneous heating.

Either linear/LFPC or switch-mode techniques can be used for power supply 20 shown in FIG. 2. When linear/LFPC techniques are used, the output is also of the 50–60 Hz conversion frequency. Although there are reactive impedances in transmission-line conductors 24 and 25, these impedances are small at 50–60 Hz compared to the resistive impedances in these conductors and cathode 16, and there are no significant impedance-matching problems with the cable lengths described in connection with FIG. 1, or even longer cable lengths. The major shortcomings of linear/LFPC techniques are the size and weight of the transformers used. Commercial versions of power supply 20 are not available because such supplies are integrated into overall power-supply units for ion sources. However, the size and weight advantages of switch-mode ac supplies should be approximately the same as described for dc supplies in connection with FIG. 1.

When switch-mode techniques are used, the output of power supply 20 is at a conversion frequency approximately 25 Khz. This frequency results from: (1) the need to have a substantially higher frequency than 50–60 Hz to obtain size and weight advantages over linear/LFPC techniques, (2) the need to exceed the audio range which for some people extends to over 20 Khz, and (3) because the transmission-line impedance-matching problems generally increase with frequency, hot-filament power supplies are usually operated at frequencies near the low end of the switch-mode range, i.e., near 25 Khz. Even at this relatively low frequency for switch-mode techniques, longer than usual cable lengths can present serious impedance-matching problems.

In summary, the prior-art circuit of FIG. 2 is the preferred approach for heating electron-emissive hot-filament cathodes because it provides the longest lifetime for a hot-filament cathode and acceptable levels of plasma disturbance with ac cathode potentials that oscillate about a mean value. When linear/LFPC techniques are used, the transmission-line problems are minimal, but the power-supply size and weight are large. When switch-mode techniques are used, the power-supply size and weight are much smaller, but the transmission-line problems can be substantial.

DESCRIPTION OF PREFERRED EMBODIMENTS

Figure 3:
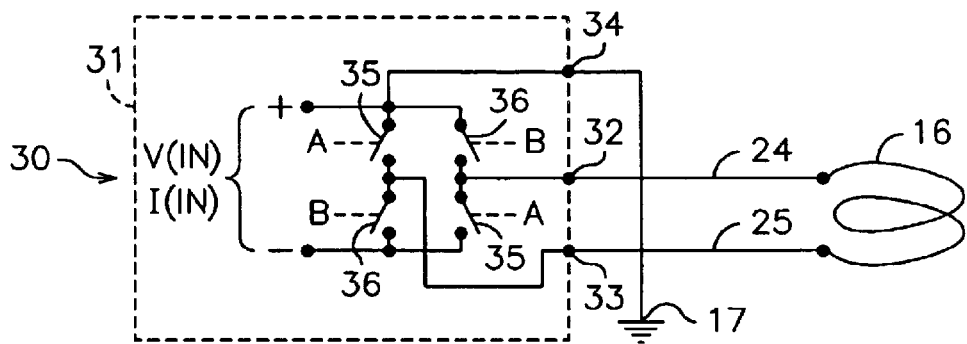
FIG. 3 is a simplified electrical circuit diagram of a hot-filament, electron-emitting cathode together with an alternating-current power supply incorporating an embodiment of the present invention to generate the heating current for the cathode and using switching means without reference to whether the switching means is mechanical, solid state, or gaseous in nature.

Referring to FIG. 3, there is shown power supply 30, within enclosure 31, which generates an alternating heating current to output terminals 32 and 33, which are connected to transmission-line conductors 24 and 25, which in turn are connected to electron-emitting hot-filament cathode 16. There is also output terminal 34 to connect to the reference potential, in this case ground 17. Inasmuch as FIG. 3 shows an ac circuit, both the resistances and reactive impedances of transmission-line conductors 24 and 25 can be significant.

Within power supply 30 there are positive terminal + and negative terminal −. Electrical power is supplied to the positive and negative terminals at potential difference V(IN) and electrical current I(in). The positive terminal is also connected internally to output terminal 34. Electrical power is supplied to the positive and negative terminals by means well understood by those skilled in the art, for example by using a commercially available switch-mode dc power supply. A linear/LFPC dc supply could also be used, but such a choice would have the disadvantage of an undesirably large and heavy transformer or transformers due to the low conversion frequency.

Within power supply 30, and also connected to the positive and negative terminals, there is a full-bridge converter comprised of two switching means 35 and two more switching means 36, without reference to whether switching means 35 and 36 are mechanical, solid state, or gaseous in nature The conduction of switching devices 35 is controlled by signal A, while the conduction of switching devices 36 is controlled by signal B. That is, signals A and B selectively and controllably change switches 35 and 36 between conducting and nonconducting states. By alternating control signals A and B, terminals 32 and 33, and therefore conductors 24 and 25, are alternatively connected to potential V with one polarity and then the opposite polarity.

Figure 3A:
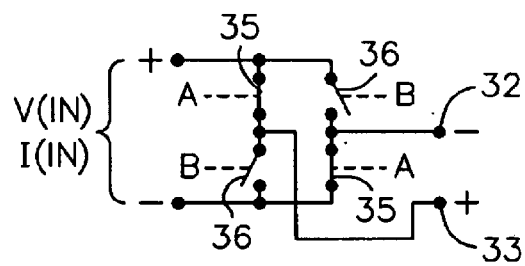
FIG. 3a shows conductivity of the switching means of FIG. 3 for the case where terminal 33 is positive relative to terminal 32.
Figure 3B:
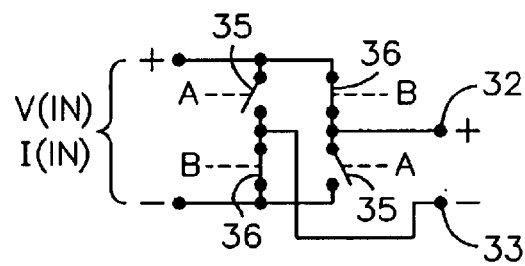
FIG. 3b shows the conductivity of the switching means of FIG. 3 for the case where terminal 32 is positive relative to terminal 33.

This alternative connection of terminals to opposite polarities can be seen more clearly by referring to FIGS. 3a and 3b. Referring first to FIG. 3a, there is shown the full-bridge converter of FIG. 3 with switching means 35 in conducting states and switching means 36 in nonconducting states, resulting in terminal 32 being connected to the negative potential and terminal 33 being connected to the positive potential. Referring next to FIG. 3b, there is shown the full-bridge converter of FIG. 3 with switching means 35 in nonconducting states and switching means 36 in conducting states, resulting in terminal 32 being connected to the positive potential and terminal 33 being connected to the negative potential.

The control signals A and B are preferably electrical, but may also magnetic or mechanical in nature. Regardless of the nature of these signals, they originate from a pulse or frequency generator using techniques well known to those skilled in the art. For example, the generator may be a simple RC oscillator, or it may be one of a number of other signal generators that can be fabricated or purchased. The output may be controlled by varying the frequency and/or duration of signals A and B. Alternatively, the output may be varied by varying voltage, V(IN), and/or current, I(IN) of the dc input.

Although intended as general switching means, switching means 35 and 36 are indicated by the schematic representations in FIG. 3 as mechanically activated switches. As such, relays could be used at some of the output switching frequencies of interest, with vacuum relays more likely to give the desired lifetime. Although the immediate actuation of the switches in relays is mechanical, the mechanical motion originates from electrical signals.

Figure 3C:
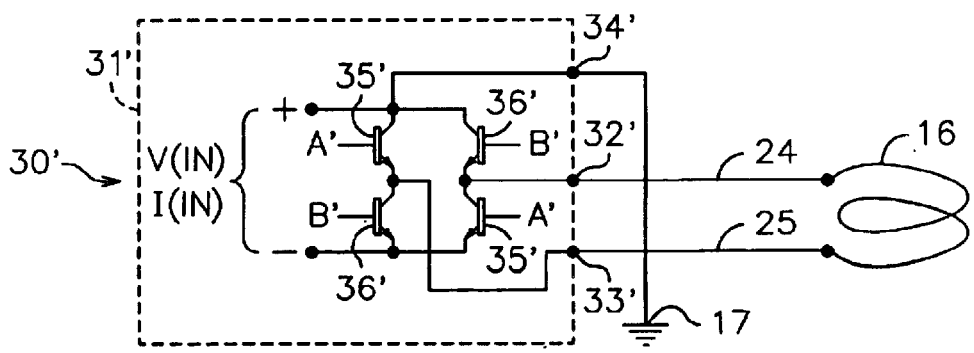
FIG. 3c shows a variation of the embodiment of the present invention that differs from that shown in FIG. 3 in that solid-state switching devices are used.

In FIG. 3c, there is shown a more specific embodiment in which the switches are of solid-state construction. The numbers of the components of power supply 30' in FIG. 3c are identical with those of power supply 30 in FIG. 3, except for the use of primes to denote the more specific embodiment of switching means in FIG. 3c. Control signals A' and B' to control solid-state switching devices 35' and 36' are electrical, and could come directly from a-pulse or frequency generator.

Figure 3D:
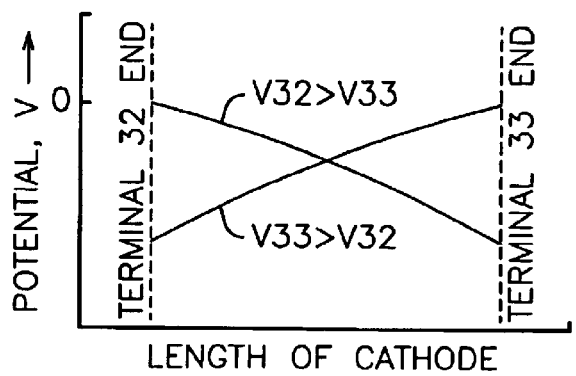
FIG. 3d shows the potential distributions along the hot-filament cathode of FIG. 3.

Referring to FIG. 3d, there are shown the potential distributions along hot-filament cathode 16 obtained using the circuits of either FIG. 3 or FIG. 3c, where the potential distributions again result from the electrical resistance of the cathode and the distribution of heating currents therein. To be more specific, the impedance of a hot-filament cathode is essentially resistive, so that a particular potential distribution has a corresponding current distribution. Because an ac heating current is used for the cathode, two curves are again shown for the peak heating currents in the two directions. One is for the case where the cathode potential nearest terminal 32, V32, is greater than the cathode potential nearest terminal 33, V33 (V32>V33), while the other is for the case where the cathode potential nearest terminal 33 is greater than the cathode potential nearest terminal 32 (V33>V32). The two curves shown in FIG. 3c were again drawn with the assumption that the waveform from power supply 30 is symmetrical for the two half-cycles of heating current. That is, that, except for sign, the shape and amplitude of the current waveform is the same.

The currents to cathode 16 are defined in a manner similar to those shown in FIG. 2b, except that primed quantities denote currents for the case where terminal 32 is positive relative to terminal 33 V32>V33), and double primed quantities denote currents for the case where terminal 33 is positive relative to terminal 22 (V33>V32). With these definitions and the assumption of a symmetrical waveform of heating current, the heating of the cathode is also symmetrical as described by equations (7) and (8).

With the exception of having the cathode potential fluctuating below the reference potential instead of around it, The cathode power supply of either FIG. 3 or FIG. 3c has the same advantages of acceptable plasma disturbance and long cathode lifetime as the power supply of FIG. 2. An important difference between the circuit of FIG. 2 and that of either FIG. 3 or FIG. 3c, however, is that the circuit of either FIG. 3 or FIG. 3c doesn't require an output transformer because it doesn't require a center tap to connect to the reference potential. The ac potential waveform can therefore be generated using switch-mode techniques but, at the same time, the frequency of the cathode heating current (output frequency) can be much lower than the conversion frequency, thereby avoiding most of the transmission-line impedance-matching problems normally encountered with switch-mode techniques.

The low end of the output frequency range for heating current results from the requirement that the duration of a heating pulse be short compared to the thermal time constant of a hot-filament cathode—to avoid having the electron emission vary with the instantaneous heating current. This thermal time constant is typically less than 0.1 second, so that the lower end of this frequency range is about ten Hz. The high end of the output frequency range results from the need to avoid the generation of irritating audio signals, while still being below the typical current frequency of about 25 Khz. Audio signal generation from any circuit components is generally poor below about one Khz, so that one Khz would be a generally conservative upper limit on frequency. The output transformer, however, is often the largest source of audio signals. Without this component, higher frequencies for heating currents will often be possible without the generation of significant audio signals. In this case, the upper limit on output frequency would be set by obtaining a substantial reduction of impedance-matching problems associated with the usual frequency of 25 Khz. Exemplar of this substantial reduction, the reactive impedance varies linearly with frequency, so that a frequency of about ten Khz or less would result in a reduction of more than 50 percent of the reactive impedance found at 25 Khz. The preferred range for heating-current frequency in this invention thus extends from about ten Hz to about ten Khz.

Figure 3E:
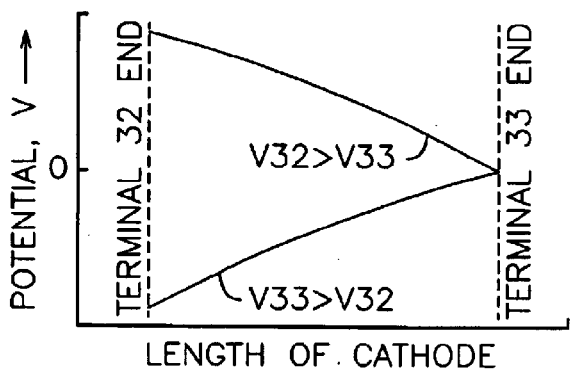
FIG. 3e shows the potential distributions that would occur along the hot-filament cathode of FIG. 3 if the reference potential (ground) were connected to terminal 33 instead of terminal 34.
Figure 3F:
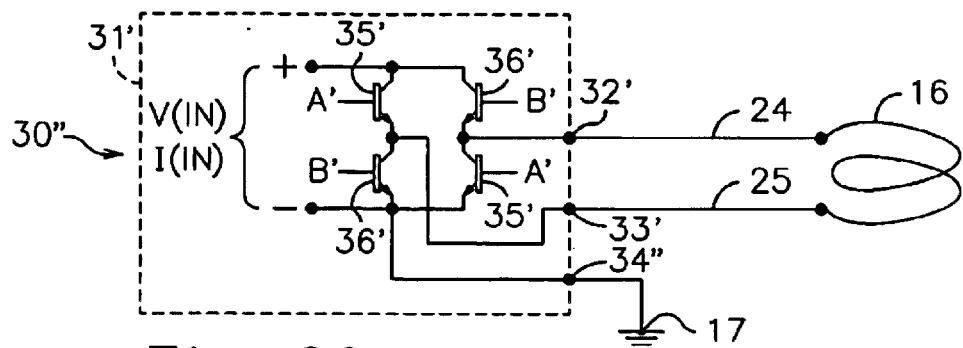
FIG. 3f shows a variation of the embodiment of the present invention that differs from that shown in FIG. 3c in that the reference potential is connected to a negative potential terminal within the power supply.
Figure 3G:
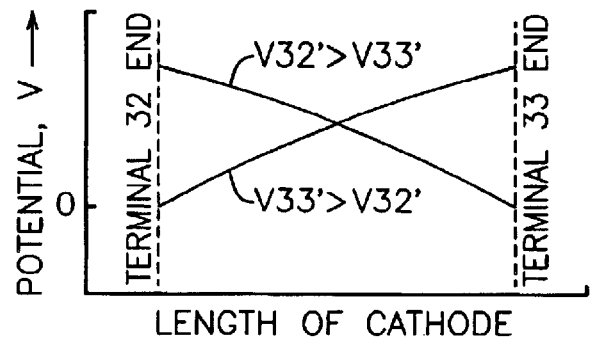
FIG. 3g shows the potential distributions along the hot-filament cathode of FIG. 3f.
Figure 3H:
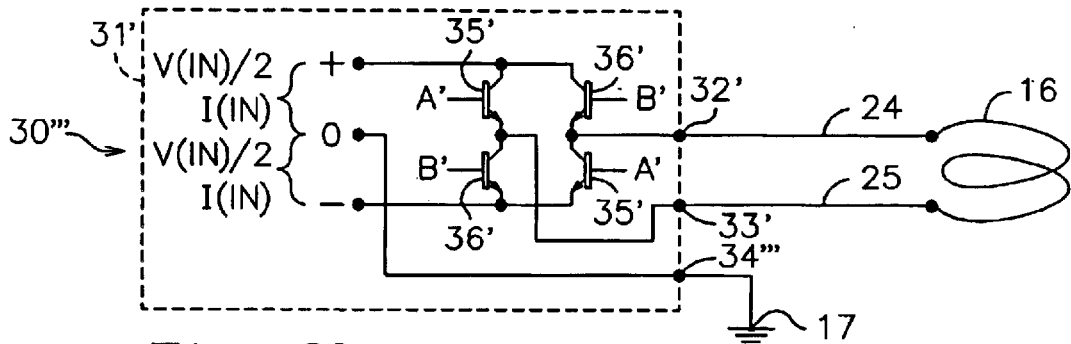
FIG. 3h shows a variation of the embodiment of the present invention that differs from that shown in FIG. 3c in that the reference potential is connected to an intermediate potential terminal within the power supply.
Figure 3I:
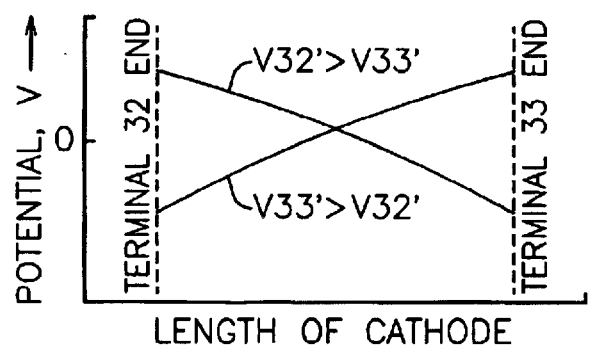
FIG. 3i shows the potential distributions along the hot-filament cathode of FIG. 3h.

The reference potential is connected to the positive potential terminal within power supply 30 (or 30') via output terminals 34 (or 34'), which is why the potential distributions in FIG. 3d extend downward from zero. If the reference potential is connected to the negative terminal within power supply 30" as shown in FIG. 3f, the potential distributions extend upward from zero as shown in FIG. 3g, but the heating of the cathode is still symmetrical. The reference potential can be connected to a potential within the power supply that is intermediate of the positive and negative potentials. In FIG. 3h the input power to the full-bridge converter within power supply 30''' comes from two power sources connected in series, each supplying half of the total input voltage (V(IN)/2). The intermediate voltage from the input is connected to output terminal 34''', which is connected to the reference potential, ground in FIG. 3h, The potential distributions along the hot-filament cathode for this reference potential are shown in FIG. 3i, The shapes of these distributions are similar to those in FIG. 3g, but they extend both above and below the reference potential of zero.

As discussed in connection with the prior-art power supply of FIG. 2, complete symmetry of the waveform is not required. Departures from symmetrical heating of 10, 20, or even 30 percent would still permit most of the increased-lifetime benefits of using an ac heating current.

The reference potential connection in FIG. 3 is important. If ground had been connected instead to output terminal 33, then the potential distributions along the cathode would be as shown in FIG. 3e, with the curve for V32>V33 extending upward from zero and the curve for V33>V32 extending downward, resulting in a large potential imbalance. For a specific example of this imbalance, the EH1000 cathode can again be used. The approximate potential drop across this cathode at operating conditions is about 25 V rms. For this voltage, the non-grounded end of cathode 16 (the end closest to terminal 32) would have a peak-to-peak amplitude of 50 V or more, depending on the exact waveform of the ac.

The increased peak-to-peak amplitude in FIG. 3e compared to FIG. 3d has two undesirable effects. Potential disturbances from a hot-filament cathode can cause potential fluctuations and charging problems at the workpiece at which the ion beam is directed. This is particularly true when the hot-filament is a neutralizer cathode on a gridded ion source or a cathode-neutralizer on a gridless ion source. The sensitivity of some workpieces to charging problems is described in an article by Olson in the *EOS/ESD Symposium,* 98–332 (1998).

The other undesirable effect is related to the dc operation of a hot-filament cathode described in connection with FIG. 1. The space-charge limit on the emitted current varies with the potential difference between the cathode and the plasma. (See the discussion of the space-charge limit on emission from a neutralizer cathode in the aforementioned article by Kaufman, et al., in the *AIAA Journal,* Vol. 20 (1982), beginning on page 745.) With the large potential swing shown in FIG. 3e, most of the emission would take place during the half-cycle where the cathode is negative of the reference potential, resulting in $$I16' < I16''. \tag{9}$$

$$I25' - I24' < I24'' - I25''. \tag{10}$$

This imbalance of the time-averaged emission currents for the two half-cycles results in a corresponding imbalance in heating near the two ends of the cathode which, in turn, can result in a reduced lifetime similar to that which results from using a dc heating current.

The same problems would have been found if the reference potential (ground) would have been connected to terminal 32, instead of terminal 33, except that the large peak-to-peak variations in potential would have occurred for the cathode end closest to terminal 33 and $$I16' > I16''. \tag{11}$$

$$I25' - I24' > I24'' - I25''. \tag{12}$$

Figure 4:
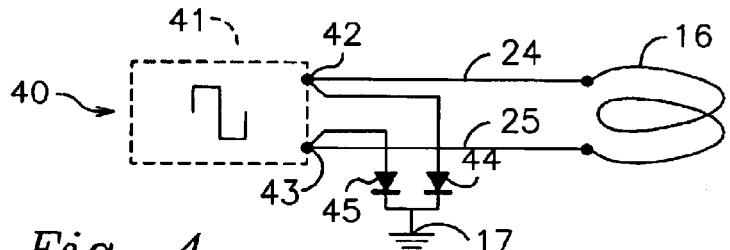
FIG. 4 is a simplified electrical circuit diagram of a hot-filament, electron-emitting cathode together with an alternating-current power supply incorporating another embodiment of the present invention to generate a heating current for the cathode.

Referring to FIG. 4, there is shown another embodiment of the present invention. Power supply 40 is within enclosure 41 and has output terminals 42 and 43, which are connected to transmission-line conductors 24 and 25, which in turn are connected to electron-emitting hot-filament cathode 16. Conductors 24 and 25 are also connected through diodes 44 and 45 to the reference potential, which in FIG. 4 is ground 17. As discussed in connection with FIGS. 1 through 3, other reference potentials could have been used. Inasmuch as the circuit in FIG. 4 is an ac one, both the resistances and reactive impedances of transmission-line conductors 24 and 25 can be significant.

Figure 4A:
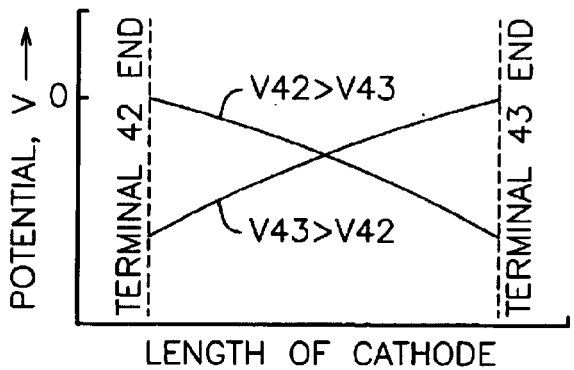
FIG. 4a shows the potential distribution along the hot-filament cathode of FIG. 4.

Referring to FIG. 4a, there is shown the potential distribution along hot-filament cathode 16 of FIG. 4. Because an ac heating current is used for the cathode, two curves are again shown for the peak heating currents in the two directions. One is for the case where the cathode potential nearest terminal 42, V42, is greater than the cathode potential nearest terminal 43, V43 (V42>V43), while the other is for the case where the cathode potential nearest terminal 43 is greater than the cathode potential nearest terminal 42 (V43>V42). The two curves shown in FIG. 4a were again drawn with the assumption that the potential waveforms from power supply 40 are symmetrical for the two half-cycles of heating current. That is, that, except for sign, the shape and amplitude of the current waveform is the same.

Either diode 44 or diode 45 will conduct whenever either end of the cathode becomes slightly positive of ground 17. Ignoring the small potential drop across a diode, the maximum potential of the two curves in FIG. 4a will therefore be ground potential (defined as zero). With the assumption of symmetrical waveforms for the two half-cycles of heating current, the heating of the cathode is also symmetrical and equations (7) and (8) are again valid. In addition, assuming that power supply 40 generates its ac waveform using direct-coupled switch-mode techniques, the output frequency can again be much lower than the conversion frequency, avoiding most of the transmission-line impedance-matching problems that are normally encountered with switch-mode techniques.

The waveform shown within enclosure 41 indicates a square-wave output, which is common when using switch-mode techniques. This square wave could be either current or voltage regulated. The waveform shape can be changed by filter components and a wide range of other waveforms would also be acceptable, including a sine wave, as long as the potential waveforms for the two half-cycles are symmetrical. Again, the requirement for symmetry is moderate, with most of the benefits of symmetry obtained with departures from symmetrical heating of 10, 20, or even 30 percent. These benefits include both the increased-lifetime benefits of using an ac heating current and the reduced plasma disturbances compared to highly unbalanced ac potential distributions as shown in FIG. 3e.

SPECIFIC EXAMPLES

Lifetime tests were carried out with a commercial EH1000 end-Hall ion source manufactured by Kaufman & Robinson, Inc., of Fort Collins, Colo. The tests used standard hot-filament neutralizer-cathodes which were fabricated from tungsten wire with a diameter of 0.51 mm and an overall length (before winding the central coiled portion) of about 15 cm. All operation was with argon as the working gas and at a discharge voltage of 150 V and an electron emission of 5 A. The use of a single working gas and operating condition was necessary for a valid comparison because lifetime varies with both the working gas and the operating condition.

Cathode lifetime tests were carried out with the commercially available end-Hall ion source EH1000 sold by Kaufman & Robinson, Inc. The source was operated on argon with a discharge of 5A at 150 V. Using a dc power supply, two tests gave lifetimes of 2.92 and 3.42 hr. A commercially available power supply for the EH1000 ion source, using linear/LFPC techniques, gave lifetimes of 4.77 and 5.20 hr. An ac cathode power supply using switch-mode techniques was fabricated in accordance with the embodiment shown in FIG. 3, with the positive potential inside the supply connected to the ground reference potential. This switch-mode supply had a conversion frequency of 50 kHz, and an output frequency of 120 Hz. Using this cathode power supply, lifetimes of 4.83 and 5.20 hr were obtained. The cathode lifetime with this supply was thus essentially the same as the power supply that used 50–60 Hz techniques, while using components that totaled less than half the weight. The 120 Hz output frequency of this power supply also avoided any significant impedance-matching problems for the transmission line between the power supply and the cathode.

DESCRIPTION OF EMBODIMENTS

Operation of the embodiment shown in FIG. 3 was not described for a frequency-modulated or pulse-width-modulated output waveform, where there may be one or more portions of each cycle during which there is no output voltage. A possible problem exists during these unpowered portions of the cycle with no output voltage. One procedure would be to have both switching devices 35 and both switching devices 36 in their nonconducting state during these unpowered portions. This would mean that there would be no conductive path from the reference potential to the cathode during an unpowered portion, and the emission of electrons would quickly increase the overall cathode potential until emission would cease.

The problem described above does not exist for the embodiment shown in FIG. 4, because the diodes always provide a conductive path from the reference potential to the cathode during the unpowered portions of a cycle period.

Avoiding the disruption of emission in the apparatus of FIG. 3 when a frequency-modulated or pulse-width-modulated waveform is generated, however, depends on whether the circuitry generating the electrical energy of the voltage V(IN) and current I(IN) is voltage-fed or current-fed. The terms "voltage-fed" and "current-fed" are well understood by those skilled in the art and are defined in section 5.6 of the aforementioned book by Pressman. To avoid short-circuiting the voltage, V(IN), for voltage-fed circuitry, the switching devices should not provide a conducting path between the positive terminal + and the negative terminal − during an unpowered portion of the cycle.

Figure 5:
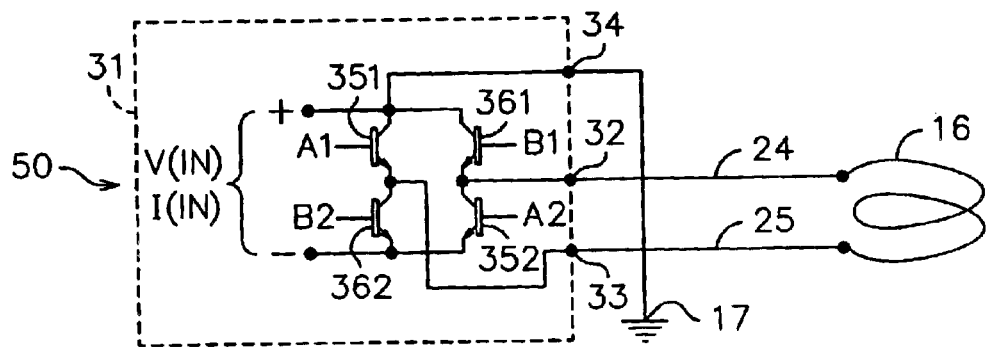
FIG. 5 is a simplified electrical circuit diagram of a hot-filament, electron-emitting cathode together with an alternating-current power supply incorporating yet another embodiment of the present invention to generate the heating current for the cathode.

Referring now to FIG. 5, there is shown an embodiment of the present invention identical to that shown in FIG. 3, except for changes that permit cathode 16 to be connected to a reference potential during unpowered portions of the cycle when drawing power from a voltage-fed circuit. In addition to the use of solid-state switching devices instead of the more general switching means, power supply 50 in FIG. 5 differs from power supply 30 in having signal A replaced by signals A1 and A2 and signal B replaced by signals B1 and B2. Instead of having signal A turn on both switching devices 35 at the same time, signal A1 controls switching device 351 and signal A2 controls switching device 352. In a similar manner, signals B1 and B2 control switching devices 361 and 362.

Figure 5A:
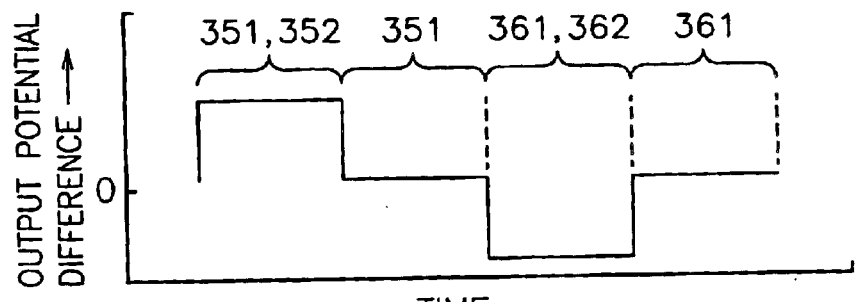
FIG. 5a shows the frequency or pulse-width modulated waveform for the output of power supply 50 in FIG. 5, together with the switching devices that are conducting during different portions of the waveform, wherein the source of dc electrical energy is voltage-fed.

Referring to FIG. 5a, there is shown a single cycle of output potential difference between terminals 32 and 33. It is assumed for FIG. 5a and the following FIG. 5b that voltage V(IN) is from a voltage-fed source of electrical power. The waveform shown is that of either a frequency-modulated or pulse-width-modulated square wave. For a frequency-modulated waveform, the portion of the cycle during which power was available would be constant, while the overall cycle period would be varied to provide regulation. For a pulse-width-modulated waveform, the overall cycle period would be constant, while the portion of the cycle during which power was available would be varied to provide regulation. Power is available to cathode 16 during the first portion of the cycle, due to signals A1 and A2 making switching devices 351 and 352 conductive. The conductive state of these switching devices is shown by the numbers 351, 352 above that portion of the cycle in FIG. 5a. (Switching devices 361 and 362 remain nonconducting during this first portion.) During the second, unpowered portion of the cycle, signal A1 makes only switching device 351 conductive, providing the conductive path from the positive terminal + to the end of cathode 16 attached to transmission-line conductor 25. During the third portion of the cycle, during which power is again available, signals B1 and B2 make both switching devices 361 and 362 conductive, as shown by the numbers 361, 362 above that portion in FIG. 5a, thereby delivering a heating current to cathode 16. During the last and also unpowered portion of the cycle, signal B1 makes only switching device 361 conductive, providing the conductive path from the positive terminal + to the end of cathode 16 attached to transmission-line conductor 24. In this manner, a conductive path is maintained between the cathode and the reference potential during the unpowered portions of the cycle. In addition, the emission current during the unpowered portions is supplied equally from the two ends of the cathode, maintaining balanced currents through the cathode during these unpowered portions.

The waveform shown in FIG. 5a has the square waveform common when using switch-mode techniques. A wide range of other waveforms would again also be acceptable, including a sine wave, as long as the potential waveforms for the two portions of the cycle during which power is available are symmetrical. Again, the requirement for symmetry is moderate, with most of the benefits of symmetry obtained with departures from symmetrical heating of 10, 20, or even 30 percent.

Figure 5B:
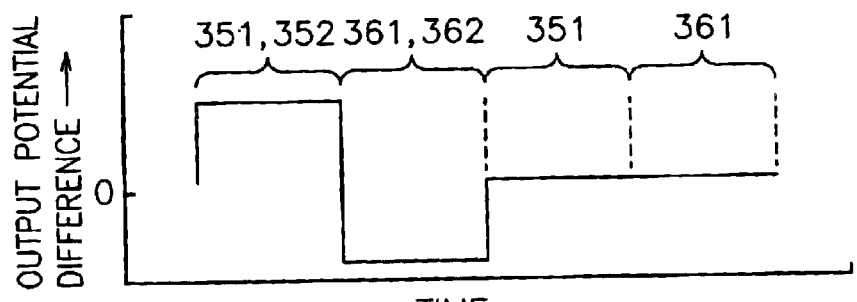
FIG. 5b shows another frequency or pulse-width modulated waveform for the output of power supply 50 in FIG. 5, together with the switching devices that are conducting during different portions of the waveform, wherein the source of dc electrical energy is also voltage fed. This waveform differs from that in FIG. 5a in that the unpowered portions of the waveform, during which no power is available to heat the cathode, are distributed in a nonsymmetrical manner.

Further, the requirement for approximate symmetry applies only to the portions of the cycle during which power is available. The unpowered portions of the cycle could be distributed in an arbitrary manner as long as the two ends of the cathode are connected to the reference potential for approximately equal times. In other words, the positive and negative portions of a cycle could be sequential, with one long unpowered period before the next two positive and negative portions, as shown in FIG. 5b. As another possibility, both ends of the cathode could be connected to the reference potential during all unpowered portions of the cycle.

Figure 5C:
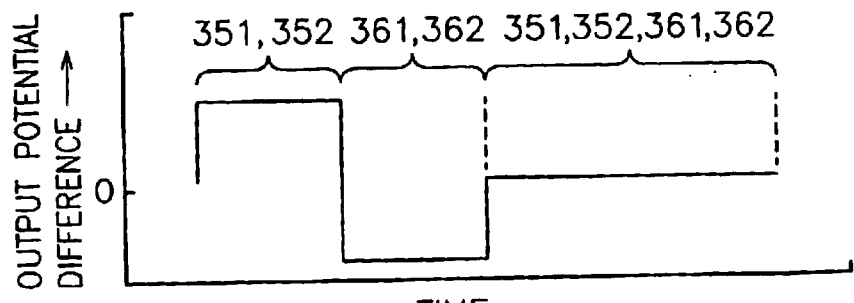
FIG. 5c shows another frequency or pulse-width modulated waveform for the output of power supply 50 in FIG. 5, together with the switching devices that are conducting during different portions of the waveform, wherein the source of the dc electrical energy is current-fed. This waveform also differs from that in FIG. 5a in that the unpowered portions of the waveform, during which no power is available to heat the cathode, are distributed in a nonsymmetrical manner.

Referring to FIG. 5c, there is shown another single cycle of output potential difference between terminals 32 and 33. It is assumed for FIG. 5c that current I(IN) is from a current-fed source of electrical power. The waveform shown is again that of either a frequency-modulated or pulse-width-modulated square wave. Power is available to cathode 16 during the first portion of the cycle, due to signals A1 and A2 making switching devices 351 and 352 conductive, thereby delivering a heating current to cathode 16. The conductive state of these switching devices is shown by the numbers 351, 352 above that portion of the cycle in FIG. 5c.

(switching devices 361 and 362 again remain nonconducting during this first portion.) During the second portion of the cycle, during which power is also available, signals B1 and B2 make both switching devices 361 and 362 conductive, as shown by the numbers 361, 362 above that portion in FIG. 5a, thereby delivering a heating current to cathode 16 that is of opposite polarity to that in the first portion. During the last and unpowered portion of the cycle, signals A1, A2, B1 and B2 make switching devices 351, 352, 361, and 362 all conductive, thereby connecting both ends of the cathode to reference potential. Those skilled in the art will recognize that a short-circuiting the output from a current-fed source of electrical power will not dissipate electrical energy, but will store it inductively. As with the waveforms of FIGS. 5a and 5b, there are other switching options for the unpowered portion of FIG. 5c. For example, any one of the four switching devices could be in a nonconducting state. As another example, the unpowered portion of the cycle could be divided equally between conduction by switches 351 and 362 and by conduction by switches 361 and 352.

From the above discussion, it should be readily apparent to one skilled in the art that the possible current waveforms for the power supply apparatus shown in FIG. 4 could include ones for which a portion of each cycle is unpowered.

Switching means 35 and 36 in FIG. 3 are indicated by the schematic representation therein as mechanical switches, although they are intended as the more general switching means. Switching devices 35' and 36' in FIG. 3c, as well as switching devices 351, 352, 361, and 362 in FIG. 5 are indicated by the schematic representations as transistors. To one skilled in the art, it should be apparent that the solid-state switching devices could also be silicon controlled rectifiers (SCRs), field-effect transistors (FETs), metal-oxide-semiconductor field-effect transistors (MOSFETs), or other solid-state devices capable of performing the switching function. Other component and circuit variations are known to those skilled in the art, while still comprising what is generally known and understood as full-bridge converters.

While particular embodiments of the present invention have been shown and described, and various alternatives have been suggested, it will be obvious to those of ordinary skill in the art that changes and modifications may be made without departing from the invention in its broadest aspects. Therefore, the aim in the appended claims is to cover all such changes and modifications as fall within the true spirit and scope of that which is patentable.

We claim:

1. A power-supply apparatus for generating an alternating heating current for an electron-emitting hot-filament cathode comprising, in the absence of an output transformer:

an internal source of positive potential;

an internal source of negative potential;

two output terminals;

a means, comprising a plurality of switching means that are selectively changed between conducting and nonconducting states, for selectively and alternatively connecting said sources of positive and negative potentials to said output terminals; and a means for directly connecting said internal source of positive potential to a reference potential.

2. The power-supply apparatus as defined in claim 1 wherein said alternating heating current has a period for a cycle, wherein each period has a portion thereof during which there is no heating current generated for said cathode.

3. A power-supply apparatus for generating an alternating heating current for an electron-emitting hot-filament cathode comprising, in the absence of an output transformer:

an internal source of positive potential;

an internal source of negative potential;

two output terminals;

a means, comprising a plurality of switching means that are selectively changed between conducting and nonconducting states, for selectively and alternatively connecting said sources of positive and negative potentials to said output terminals; and a means for directly said internal source of negative potential to a reference potential.

4. The power-supply apparatus as defined in claim 3 wherein said alternating heating current has a period for a cycle, wherein each period has a portion thereof during which there is no heating current generated for said cathode.

5. The power-supply apparatus as defined in claims 1 through 4 wherein said power supply comprises a switch-mode power supply.

6. The power-supply apparatus as defined in claims 1 through 4 wherein said alternating heating current has a frequency between ten Hz and 10 kHz.

7. A power-supply apparatus, without an output transformer, for generating an alternating heating current for an electron-emitting hot-filament cathode comprising:

internal sources of positive and negative potential;

two output terminals;

a means for alternatively connecting said sources of positive and negative potential to said output terminals; and two diodes, each having first and second ends and each having a polarity in which the positive-current conduction direction is from said first end to said second end of each, with said first ends connected respectively to said two output terminals, and with said second ends both connected to a single reference potential.

8. The power-supply apparatus as defined in claim 7, wherein said alternating heating current has a period for a cycle, wherein each period has a portion thereof during which there is no heating current generated for said cathode.

9. The power-supply apparatus as defined in claim 7 or 8 wherein said power supply comprises a switch-mode techniques power supply.

10. The power-supply apparatus as defined in claim 7 or 8 wherein said alternating heating current has a frequency between ten Hz and 10 kHz.

* * * * *